United States Patent
Shibasaki

(10) Patent No.: US 9,520,883 B2
(45) Date of Patent: Dec. 13, 2016

(54) FREQUENCY DETECTION CIRCUIT AND RECEPTION CIRCUIT

(71) Applicant: FUJITSU LIMITED, Kawasaki-shi, Kanagawa (JP)

(72) Inventor: Takayuki Shibasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/834,927

(22) Filed: Aug. 25, 2015

(65) Prior Publication Data
US 2016/0099718 A1 Apr. 7, 2016

(30) Foreign Application Priority Data

Oct. 2, 2014 (JP) ................................. 2014-203584

(51) Int. Cl.
*H03L 7/06* (2006.01)
*H03L 7/085* (2006.01)
*H03L 7/087* (2006.01)
*H03L 7/089* (2006.01)

(52) U.S. Cl.
CPC .............. *H03L 7/085* (2013.01); *H03L 7/087* (2013.01); *H03L 7/089* (2013.01)

(58) Field of Classification Search
USPC .............. 327/2–12, 105–123, 141, 144–163; 331/15–17; 375/373–376
See application file for complete search history.

(56) References Cited

U.S. PATENT DOCUMENTS

| 6,055,286 A | 4/2000 | Wu et al. | |
| 6,754,256 B1* | 6/2004 | Kubo | H04B 1/7075 370/335 |
| 2002/0021153 A1* | 2/2002 | Saeki | H03K 5/133 327/163 |
| 2004/0124929 A1 | 7/2004 | Ishiwaki | |
| 2005/0060616 A1* | 3/2005 | Cho | H03K 5/135 714/34 |
| 2006/0285366 A1* | 12/2006 | Radecker | H02M 3/33507 363/16 |
| 2009/0290672 A1* | 11/2009 | Ho | H03L 7/0814 375/374 |

(Continued)

FOREIGN PATENT DOCUMENTS

JP  2004-153396 A  5/2004
JP  2004-214825 A  7/2004

*Primary Examiner* — Brandon S Cole
(74) *Attorney, Agent, or Firm* — Arent Fox LLP

(57) ABSTRACT

A frequency detection circuit includes: a first comparison circuit configured to output a first comparison result produced by comparison between a second threshold value higher than a first threshold value; a second comparison circuit configured to output a second comparison result produced by comparison between a third threshold value lower than the first threshold value; a third comparison circuit configured to output a third comparison result produced by comparison between the input data, and the first threshold value at second timing of a second clock; a phase detector configured to determine in which one of the areas an edge of the input data is positioned among the three areas produced by dividing a phase in a one-bit width time into three areas; and a phase rotation detector configured to detect a rotation direction of the phase based on a change of a detection result in the phase detector.

6 Claims, 20 Drawing Sheets

(56) References Cited

U.S. PATENT DOCUMENTS

| | | | |
|---|---|---|---|
| 2011/0235688 A1* | 9/2011 | Umeda | H04L 5/0048 375/216 |
| 2015/0207618 A1* | 7/2015 | Tsunoda | H04L 7/0331 375/374 |
| 2016/0194027 A1* | 7/2016 | Kondo | B62D 5/04 324/207.25 |

* cited by examiner

FIG. 2

| $E_{n-1}$ | $D_{Hn}$ | $D_{Ln}$ | $E_n$ | $PH_A$ | $PH_B$ | $PH_C$ |
|---|---|---|---|---|---|---|
| 0 | 0 | 0 | 1 | 1 | 0 | 0 |
| 1 | 1 | 1 | 0 | 1 | 0 | 0 |
| 0 | 1 | 1 | 1 | 0 | 1 | 0 |
| 1 | 0 | 0 | 0 | 0 | 1 | 0 |
| 0 | 0 | 1 | 1 | 0 | 0 | 1 |
| 1 | 0 | 1 | 0 | 0 | 0 | 1 |
| OTHER | | | | 0 | 0 | 0 |

FIG. 6

| THE PREVIOUS STATE | THE CURRENT STATE | $FR_{UD}$ |
|---|---|---|
| $PH_B=1$ | $PH_C=1$ | +1 |
| $PH_C=1$ | $PH_A=1$ | +1 |
| $PH_A=1$ | $PH_C=1$ | -1 |
| $PH_C=1$ | $PH_B=1$ | -1 |
| OTHER | | 0 |

FIG. 12

| $D_{On-1}$ | $E_n$ | $D_{On}$ | $PH_{UD}$ |
|---|---|---|---|
| 0 | 1 | 1 | +1 |
| 1 | 0 | 0 | +1 |
| 0 | 0 | 1 | -1 |
| 1 | 1 | 0 | -1 |
| OTHER | | | 0 |

FIG. 16

| THE SECOND STATE BEFORE | THE FIRST STATE BEFORE | THE CURRENT STATE | $FR_{UD}$ |
|---|---|---|---|
| $PH_B=1$ | $PH_C=1$ | $PH_A=1$ | +1 |
| $PH_A=1$ | $PH_C=1$ | $PH_B=1$ | -1 |
| OTHER | | | 0 |

FREQUENCY DETECTION CIRCUIT AND RECEPTION CIRCUIT

CROSS-REFERENCE TO RELATED APPLICATION

This application is based upon and claims the benefit of priority of the prior Japanese Patent Application No. 2014-203584, filed on Oct. 2, 2014, the entire contents of which are incorporated herein by reference.

FIELD

The embodiments discussed herein are related to a frequency detection circuit, and a reception circuit.

BACKGROUND

In recent years, with the performance improvement of information processing apparatuses, the data rate of data signals transmitted and received inside and outside the apparatuses is being increased.

In a reception circuit, clock and data recovery (CDR), which reproduces data and a clock from a transmitted data signal, is carried out.

As one of methods of CDR, a method of interpolating a phase of a reference clock to generate sampling clocks, and reproducing data using the sampling clocks is provided. In this method, it becomes possible to make a phase adjustment with high precision using a reference clock having high precision. However, a clock source for generating a reference clock having high precision is used, and thus the cost and the circuit size are increased.

On the other hand, a method of performing data sampling using a clock reproduced from input data without using a reference clock, and outputting data with reduced jitter is provided. In this method, the phase difference and the frequency difference between a clock and input data is detected so that adjustment of the clock is carried out. Here, the phase of the clock is detected using a 2× sampling method, in which sampling is performed two times in one unit interval (UI). On the other hand, the frequency of the clock is detected using a 4× sampling method, in which sampling is performed four times in one UI.

In CDR not using a reference clock, if a frequency is detected by the 4× sampling method as described above, the area of a circuit that performs sampling becomes relatively large.

The following are reference documents.
[Document 1] Japanese Laid-open Patent Publication No. 2004-214825,
[Document 2] Japanese Laid-open Patent Publication No. 2004-153396 and
[Document 3] U.S. Pat. No. 6,055,286.

SUMMARY

According to an aspect of the invention, a frequency detection circuit includes: a first comparison circuit configured to output a first comparison result produced by comparison between a second threshold value higher than a first threshold value corresponding to a center value of an amplitude level of input data, and the input data at first timing of a first clock; a second comparison circuit configured to output a second comparison result produced by comparison between a third threshold value lower than the first threshold value, and the input data at the first timing; a third comparison circuit configured to output a third comparison result produced by comparison between the input data, and the first threshold value at second timing of a second clock having a phase shifted from that of the first clock; a phase detector configured to determine in which one of the areas an edge of the input data is positioned among the three areas produced by dividing a phase in a one-bit width time into three areas based on the first comparison result, the second comparison result, and the third comparison result; and a phase rotation detector configured to detect a rotation direction of the phase based on a change of a detection result in the phase detector so as to determine whether a second frequency of the first clock or the second clock is higher or lower with respect to a first frequency of the input data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a diagram illustrating an example of a truth table achieved by a phase detection circuit;

FIG. 6 is a diagram illustrating an example of frequency control by a phase rotation detection circuit;

FIG. 12 is a diagram illustrating an example of a truth table achieved by the phase control unit;

FIG. 16 is a diagram illustrating an example of frequency control by the phase rotation detection unit;

DESCRIPTION OF EMBODIMENTS

In the following, descriptions will be given of embodiments of the disclosure with reference to the drawings.

First Embodiment

Figure 1:
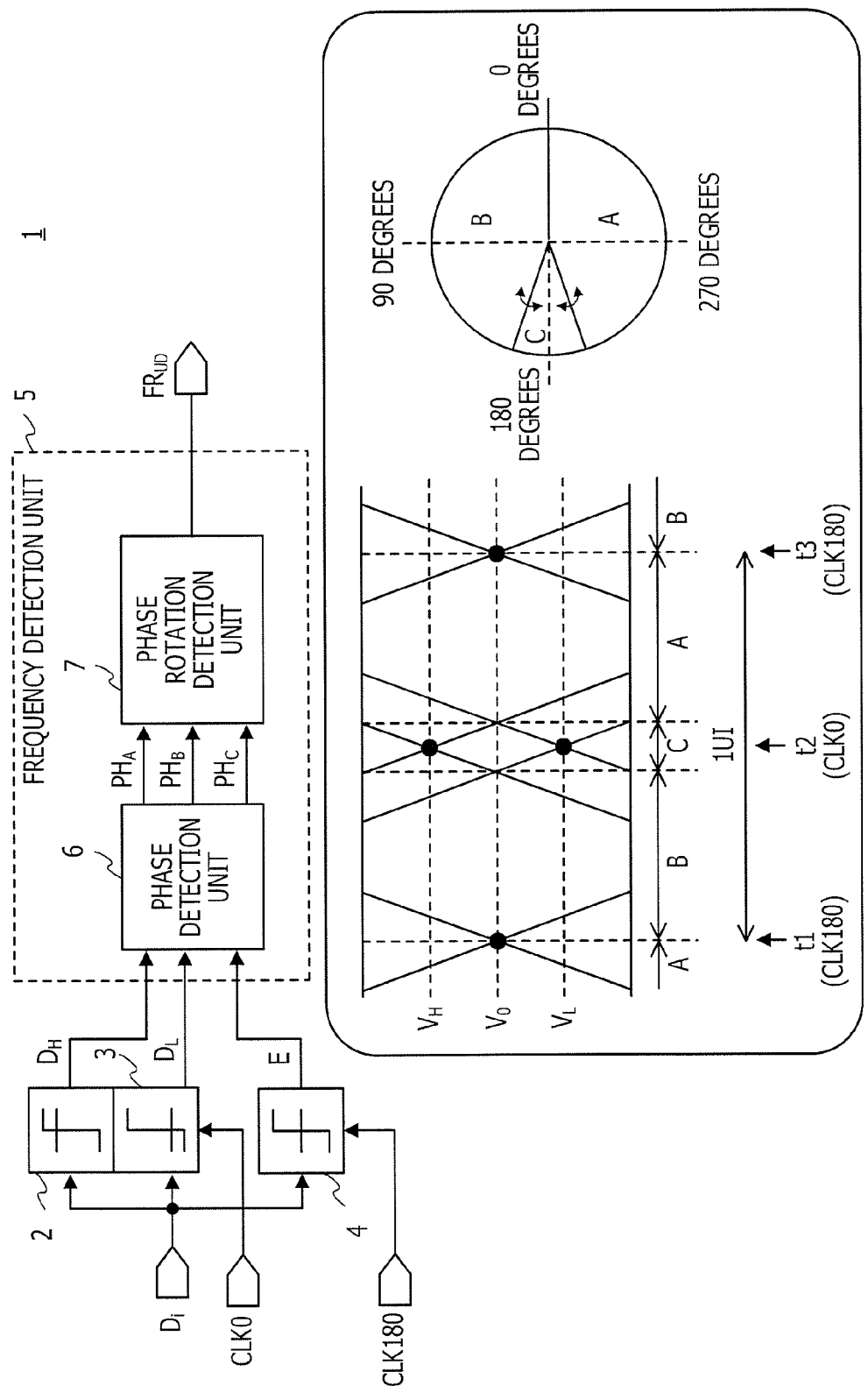
FIG. 1 is a diagram illustrating an example of a frequency detection circuit according to a first embodiment.

FIG. 1 is a diagram illustrating an example of a frequency detection circuit according to a first embodiment.

A frequency detection circuit 1 includes comparison circuits 2, 3, and 4, and a frequency control unit 5.

The comparison circuit 2 compares input data $D_i$ and a threshold value $V_H$ at timing of a sampling clock (hereinafter referred to simply as a clock) CLK0, and outputs a comparison result $D_H$ thereof. The threshold value $V_H$ is a threshold value higher than a threshold value $V_0$ corresponding to a center value of the amplitude level of input data $D_i$.

For example, the comparison circuit 2 outputs the comparison result $D_H$ that becomes "1" when the input data $D_i$ is higher than the threshold value $V_H$, and outputs the comparison result $D_H$ that becomes "0" when the input data $D_i$ is lower than the threshold value $V_H$.

The comparison circuit 3 compares the input data $D_i$ and the threshold value $V_L$ at the same timing as the comparative timing by the comparison circuit 2, and outputs a comparison result $D_L$ thereof. The threshold value $V_L$ is a threshold value lower than the threshold value $V_0$.

For example, the comparison circuit 3 outputs the comparison result $D_L$ that becomes "1" when the input data $D_i$ is higher than the threshold value $V_L$, and outputs the comparison result $D_L$ that becomes "0" when the input data $D_i$ is lower than the threshold value $V_L$.

The comparison circuit 4 compares the input data $D_i$ and the threshold value $V_0$ at timing of a clock CLK180, and outputs a comparison result E thereof.

For example, the comparison circuit 4 outputs the comparison result E that becomes "1" when the input data $D_i$ is higher than the threshold value $V_0$, and outputs the comparison result E that becomes "0" when the input data $D_i$ is lower than the threshold value $V_0$.

In this regard, the clocks CLK0 and CLK180 are generated by a voltage controlled oscillator (VCO) described below, for example, based on the input data $D_i$. The clock CLK180 has a shifted phase with respect to the clock CLK0. For example, the rising (or falling) timing of the clock CLK180 is shifted from the rising (or falling) timing of the clock CLK0 by half the one-bit width time period (hereinafter referred to as one UI). When processing is performed at a frequency (baud frequency) corresponding to the data rate (baud rate) of the input data $D_i$, the clock CLK180 has a phase difference of 180 degrees with respect to the clock CLK0. Also, the frequency of the input data $D_i$ is based on the superimposed clock, and the frequency of the clocks CLK0 and the CLK180 match this frequency so that the clock is reproduced.

The frequency control unit 5 includes a phase detection circuit 6, and a phase rotation detection circuit 7.

The phase detection circuit 6 detects in which area an edge of the input data $D_i$ is positioned among the three areas of the phase in one UI of the input data $D_i$ based on the comparison results $D_H$, $D_L$, and E. In the following, it is assumed that the three areas of the phase in one UI are set to be areas A, B, and C, respectively.

FIG. 1 illustrates an example of setting the areas A, B, and C. The horizontal axis represents time, and the vertical axis represents the amplitude level of the input data. The timing t1 and t3 are rising (or falling) timing by the clock CLK180, and the timing t2 is rising (or falling) timing of the clock CLK0.

The area A is a range having the ending point of the area C as a starting point, and the timing t1 and t3 of the clock CLK180 as an ending point. The area B is a range having the timing t1 and t3 (the ending point of the area A) of the clock CLK180 as a starting point, and the starting point of the area C as an ending point. In the example in FIG. 1, the starting point of the area B, and the ending point of the area A have a phase of 0 degrees.

The area C is set to have a range having the clock timing t2 of the CLK0 as center between the areas A and B. The width of the area C changes in accordance with the slew rate of the input data $D_i$, and the above-described threshold values $V_H$ and VL. For example, if the slew rate of the input data $D_i$ is low, the area C becomes wide, and if the slew rate is high, the area C becomes narrow. Also, for example, the higher the threshold value $V_H$, or the lower the threshold value $V_L$, the wider the area C becomes. In the opposite case, the area C becomes narrow. The areas A and B change in accordance with the width of the area C.

Here, the ranges of the frequencies of the detectable clocks CLK0 and CLK180 and the detection rate change in accordance with the width of the area C. This is because if the area C is too narrow, there is a possibility that a change (phase rotation) spreading over the areas A to C is not detected even if the frequency of the clocks CLK0 and CLK180 change. Accordingly, the threshold values $V_H$ and $V_L$ of the comparison circuits 2 and 3, and the range of the area C are set in accordance with the characteristics, such as the slew rate, and the like of the input data $D_i$, so as to make it possible to achieve the detection rate of a desired frequency.

The phase detection circuit 6 determines in which area of the above-described areas A to C, the edge of the input data $D_i$ is positioned from the relationships in a truth table (refer to FIG. 2) as described later, for example, based on the comparison results $D_H$, $D_L$, and E.

The phase detection circuit 6 outputs, for example, a signal $PH_A$ that becomes "1" when detecting that the edge of the input data $D_i$ is in the area A, a signal $PH_B$ that becomes "1" when detecting that the edge of the input data $D_i$ is in the area B, and a signal $PH_C$ that becomes "1" when detecting that the edge of the input data $D_i$ is in the area C.

The phase rotation detection circuit 7 detects the rotation direction of the phase of the input data $D_i$ based on a change of the detection result of the phase detection circuit 6 so as to determine whether the frequency of the clocks CLK0 and CLK180 is higher or lower than the frequency of the input data $D_i$.

The phase rotation detection circuit 7 detects, for example, the rotation direction of the phases of the clocks CLK0 and the CLK180 with respect to the input data $D_i$ from a change in the states of the signals $PH_A$, $PH_B$, and $PH_C$, which are output from the phase detection circuit 6. From this rotation direction, the phase rotation detection circuit 7 detects a difference between the frequency of the input data $D_i$, and the frequency of the clocks CLK0 and CLK180. From the rotation direction of the phase, it is understood whether the frequency of the clocks CLK0 and CLK180 is higher or lower with respect to the frequency of the input data $D_i$ (the reason will be described later). The phase rotation detection circuit 7 outputs frequency information $FR_{UD}$, which controls the frequency of the clocks CLK0 and CLK180 based on the detection result.

In this regard, in FIG. 1, a control clock that is input to the frequency control unit 5, and the like are omitted in the illustration. Also, a part that generates the clocks CLK0 and CLK180 having a frequency based on the frequency information $FR_{UD}$ is omitted in the illustration.

In the following, a description will be given of operation example of the frequency detection circuit 1 according to the present embodiment.

Operation Example of Frequency Detection Circuit

First, the comparison circuits 2 and 3 make comparisons between the input data $D_i$, and the threshold values $V_H$ and $V_L$, respectively at the timing of the clock CLK0, and outputs the comparison results $D_H$ and $D_L$, respectively. Also, the comparison circuit 4 compares the input data $D_i$ with the threshold value $V_0$ at the timing of the clock CLK180, and outputs the comparison result E.

For example, the comparison circuit 4 compares the input data $D_i$, and the threshold value $V_0$ at timing t1 and t3 of the clock CLK180. Also, for example, the comparison circuits 2 and 3 makes comparisons between the input data $D_i$, and the threshold values $V_H$ and $V_L$, respectively at timing t2 of the clock CLK0.

After that, the phase detection circuit 6 performs operation for achieving a truth table as illustrated below, for example, from the comparison results $D_H$, $D_L$, and E, determines in which area out of the areas A, B, and C the edge of the input data $D_i$ is positioned, and outputs the signals $PH_A$, $PH_B$, and $PH_C$.

FIG. 2 is a diagram illustrating an example of a truth table achieved by the phase detection circuit.

A subscript n in the comparison results E, $D_H$, and $D_L$ represents time series. For example, the comparison result $E_{n-1}$ represents the comparison result E of one UI before with respect to the comparison result $E_n$. Also, in the truth table illustrated in FIG. 2, the values of the signals $PH_A$, $PH_B$, and $PH_C$ that are output correspondingly to the six combinations of the comparison results $E_{n-1}$, $D_{Hn}$, $D_{Ln}$, and $E_n$ are illustrated. In the following, a description will be given of examples of edge states of the input data $D_i$ in which the signals $PH_A$, $PH_B$, and $PH_C$ that individually become "1" are output.

Figure 3:
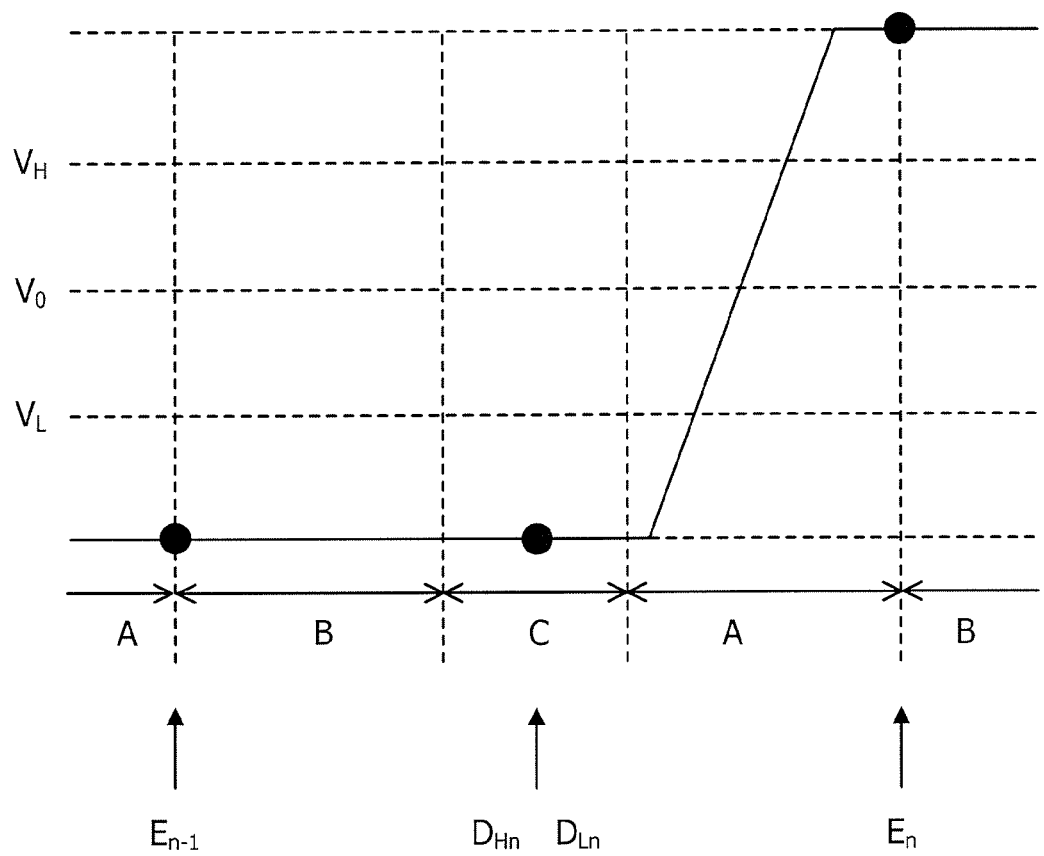
FIG. 3 is a diagram illustrating an example of the case where an edge of input data is positioned in an area.

FIG. 3 is a diagram illustrating an example of the case where an edge of the input data is positioned in the area A.

FIG. 3 illustrates a waveform when the input data $D_i$ changes from "0" to "1" in the area A. In such a waveform, the comparison results $E_{n-1}$, $D_H$, and $D_L$ become "0", and the comparison result $E_n$ becomes "1". At this time, from the truth table illustrated in FIG. 2, the signal $PH_A$ becomes "1", and is detected if the edge of the input data $D_i$ is positioned in the area A.

In this regard, when the input data $D_i$ changes from "1" to "0" in the area A, the comparison results $E_{n-1}$, $D_H$, and $D_L$ become "1", and the comparison result $E_n$ becomes "0". At this time, as the truth table illustrated in FIG. 2, the signal $PH_A$ becomes "1", and is detected if the edge of the input data $D_i$ is positioned in the area A in the same manner as described above.

Figure 4:
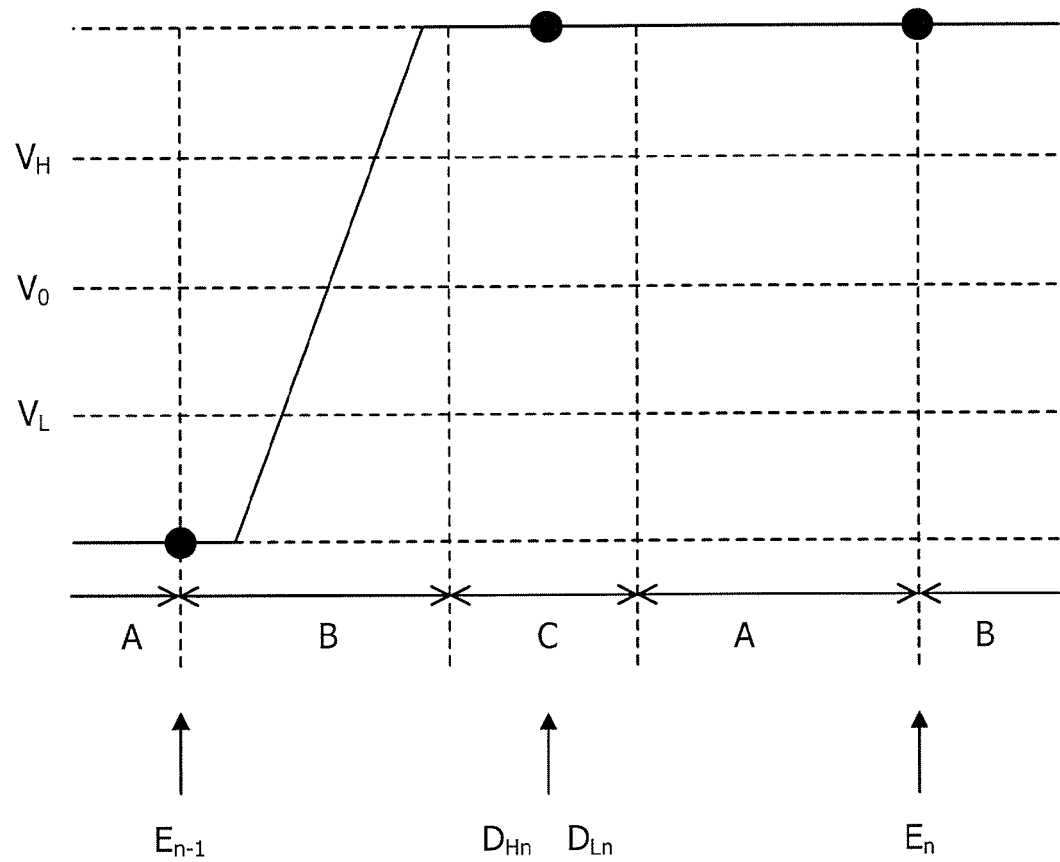
FIG. 4 is a diagram illustrating an example of the case where an edge of input data is positioned in another area.

FIG. 4 is a diagram illustrating an example of the case where an edge of input data is positioned in the area B.

FIG. 4 illustrates a waveform when the input data $D_i$ changes from "0" to "1" in the area B. In such a waveform, the comparison result $E_{n-1}$ becomes "0", and the comparison results $D_H$, $D_L$, and $E_n$ become "1". At this time, from the truth table illustrated in FIG. 2, the signal $PH_B$ becomes "1", and is detected if the edge of the input data $D_i$ is positioned in the area B.

In this regard, when the input data $D_i$ changes from "1" to "0" in the area B, the comparison result $E_{n-1}$ becomes "1", and the comparison results $D_H$, $D_L$, and $E_n$ become "0". At this time, as the truth table illustrated in FIG. 2, the signal PHB becomes "1", and is detected if the edge of the input data $D_i$ is positioned in the area B in the same manner as described above.

Figure 5:
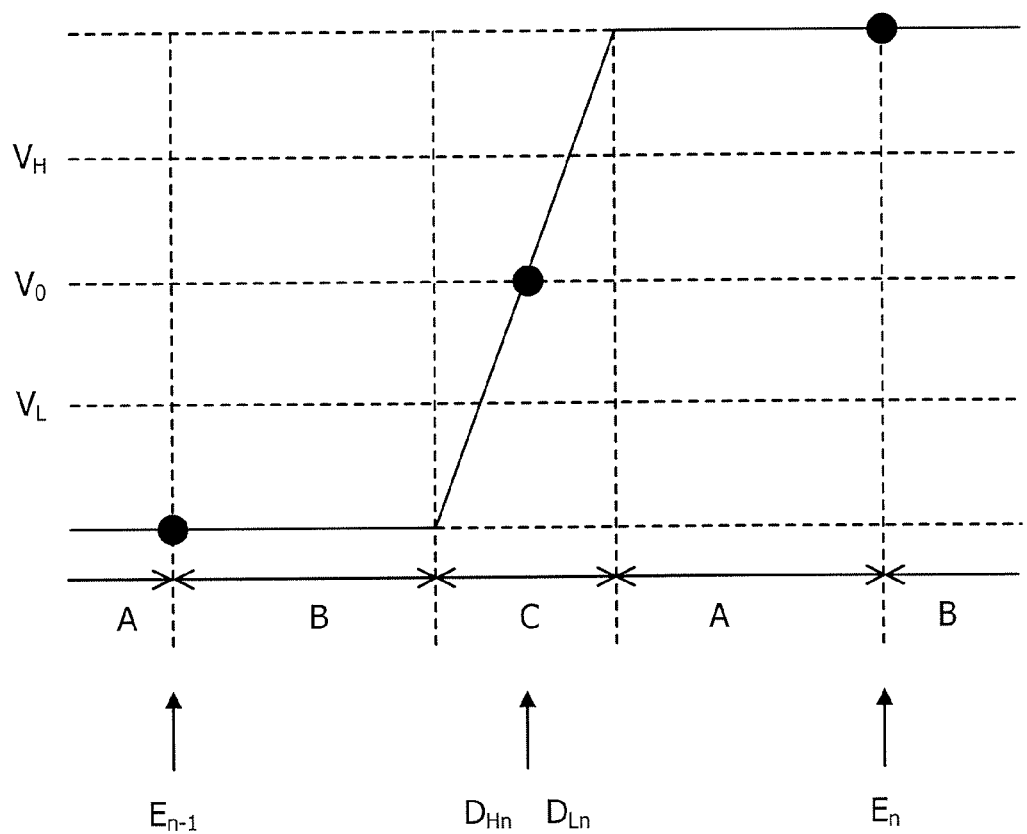
FIG. 5 is a diagram illustrating an example of the case where an edge of input data is positioned in further another area.

FIG. 5 is a diagram illustrating an example of the case where an edge of input data is positioned in the area C.

FIG. 5 illustrates a waveform when the input data $D_i$ changes from "0" to "1" in the area C. In such a waveform, the comparison result $E_{n-1}$ becomes "0", and the comparison result $E_n$ becomes "1". Further, since the potential level of the input data $D_i$ at the time of the comparison is higher than the threshold value $V_L$, and lower than the threshold value $V_H$, the comparison results $D_H$, and $D_L$ become "0" and "1", respectively. At this time, from the truth table illustrated in FIG. 2, the signal $PH_C$ becomes "1", and is detected if the edge of the input data $D_i$ is positioned in the area C.

In this regard, when the input data $D_i$ changes from "1" to "0" in the area C, the comparison result $E_{n-1}$ becomes "1", and the comparison result $E_n$ becomes "0". Further, since the potential level of the input data $D_i$ at the time of the comparison is higher than the threshold value $V_L$, and lower than the threshold value $V_H$, the comparison results $D_H$, and $D_L$ become "1" and "0", respectively. At this time, from the truth table illustrated in FIG. 2, the signal $PH_C$ becomes "1", and is detected if the edge of the input data $D_i$ is positioned in the area C.

In this regard, if the phase detection circuit 6 detects the values other than the values of the six combinations of the comparison results $E_{n-1}$, $D_{Hn}$, $D_{Ln}$, and $E_n$ as illustrated in FIG. 2, the phase detection circuit 6 outputs "0".

Next, the phase rotation detection circuit 7 detects the rotation direction of the phases of the clocks CLK0 and CLK180 based on a change in the signals $PH_A$ to $PH_C$. For example, the phase rotation detection circuit 7 performs operation for achieving the table as illustrated below, and outputs the frequency information $FR_{UD}$ based on the rotation direction of the phase.

FIG. 6 is a diagram illustrating an example of frequency control by the phase rotation detection circuit.

In the table illustrated in FIG. 6, the state before a change in the signals $PH_A$ to $PH_C$ (hereinafter expressed as the previous state), and the frequency information $FR_{UD}$ that is output correspondingly to the state after the change in the signals $PH_A$ to $PH_C$ (hereinafter expressed as the current state). In this regard, "the previous state" in the table illustrated in FIG. 6 may be a state of before one UI or more from "the current state". For example, when "the previous state" is "$PH_B$=1", and "the current state" is "$PH_C$=1", before "the current state" in which "$PH_C$=1", the signal $PH_B$ that becomes "1" for a plurality of times may be input.

As illustrated in the table in FIG. 6, it is assumed that "the previous state" of the input signals $PH_A$ to $PH_C$ is "$PH_B$=1", and "the current state" is "$PH_C$=1". At this time, the rotation direction of the phases of the clocks CLK0 and CLK180 is from the area B to the area C as illustrated in FIG. 1. This is a state in which the phase of the clocks CLK0 and CLK180 with respect to the input data $D_i$ is getting delayed with time, and the cycle of the clocks CLK0 and CLK180 is longer than one UI. That is to say, this is a state in which the frequency of the clocks CLK0 and CLK180 is lower with respect to the input data $D_i$. Accordingly, in order to increase the frequency of the clocks CLK0 and CLK180, the phase rotation detection circuit 7 outputs the frequency information $FR_{UD}$ that becomes "+1".

When "the previous state" is "$PH_C$=1", and "the current state" is "$PH_A$=1", the rotation direction of the phases of the clocks CLK0 and CLK180 is from the area C to the area A as illustrated in FIG. 1. At this time, this also becomes a state in which the frequency of the clocks CLK0 and CLK180 is lower with respect to the input data $D_i$ in the same manner. Accordingly, in order to increase the frequency of the clocks CLK0 and CLK180, the phase rotation detection circuit 7 outputs the frequency information $FR_{UD}$ that becomes "+1".

On the other hand, as illustrated in the table in FIG. 6, it is assumed that "the previous state" of the input signals $PH_A$ to $PH_C$ is "$PH_A$=1", and "the current state" is "$PH_C$=1". At this time, the rotation direction of the phases of the clocks CLK0 and CLK180 is from the area A to the area C as illustrated in FIG. 1. This is a state in which the phase of the clocks CLK0 and CLK180 is advanced with respect to the input data $D_i$ with time, and the cycle of the clocks CLK0 and CLK180 is shorter than one UI That is to say, this is a state in which the frequency of the clocks CLK0 and CLK180 is higher with respect to the input data $D_i$. Accordingly, in order to decrease the frequency of the clocks CLK0 and CLK180, the phase rotation detection circuit 7 outputs the frequency information $FR_{UD}$ that becomes "−1".

When "the previous state" is "$PH_C$=1", and "the current state" is "$PH_B$=1", the rotation direction of the phases of the clocks CLK0 and CLK180 is from the area C to the area B as illustrated in FIG. 1. At this time, this also becomes a state in which the frequency of the clocks CLK0 and CLK180 is higher with respect to the input data $D_i$ in the same manner. Accordingly, in order to decrease the frequency of the clocks CLK0 and CLK180, the phase rotation detection circuit 7 outputs the frequency information $FR_{UD}$ that becomes "−1".

Also, if the input signals $PH_A$ to $PH_C$ have the values other than the above-described combinations, the phase rotation detection circuit 7 sets the frequency information $FR_{UD}$ to "0". In this regard, the phase rotation detection circuit 7 may output "+1", "−1", and "0" of the frequency information $FR_{UD}$ as a two-bit value.

Also, after the input data $D_i$ is subjected to equalization processing, the input data $D_i$ may be input into the comparison circuits 2 to 4.

Also, it is possible for the phase rotation detection circuit 7 to hold the states of the signals $PH_A$ to $PH_C$ in a storage unit not illustrated, and to use the state as "the previous state" illustrated in FIG. 6. In such a case, when the states of the signals $PH_A$ to $PH_C$ change, it is possible to update "the current state" after the state change of the signals $PH_A$ to $PH_C$ as "the previous state" of the storage unit, and use them.

In the following, before the advantages of the frequency detection circuit 1 according to the present embodiment are described, a description will be given of an example of a reception circuit that performs sampling four times in one UI, and detects the frequency difference between the data signal and the clock as a comparative example.

Comparative Example

Figure 7:
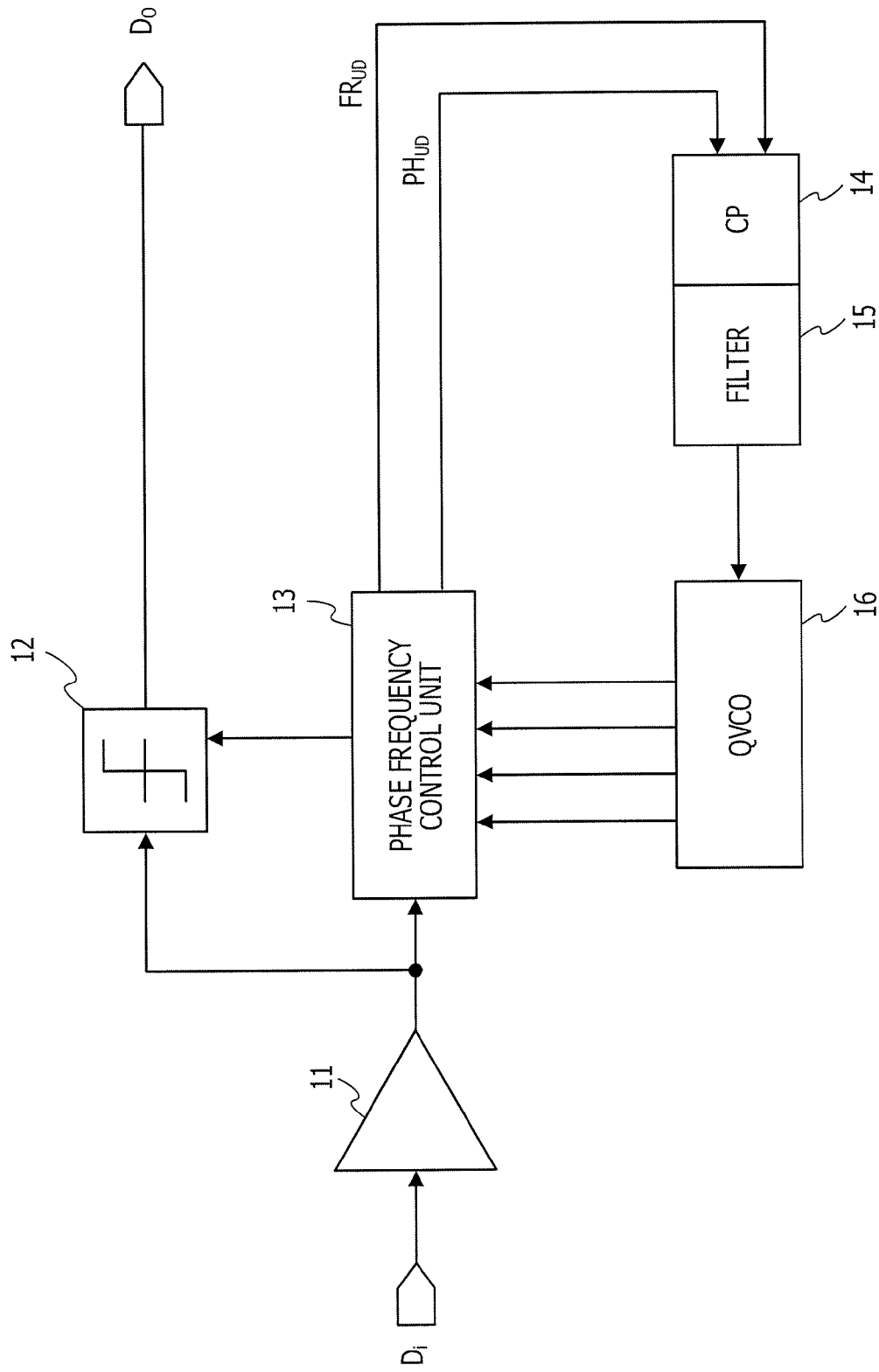
FIG. 7 is a diagram illustrating a comparative example of a reception circuit.

FIG. 7 is a diagram illustrating a comparative example of the reception circuit. Also, in FIG. 7, a control clock that is input into the phase frequency control unit 13, and the like are omitted in the illustration.

The reception circuit 10 includes a buffer 11, a comparison circuit 12, a phase frequency control unit 13, a quadrature voltage controlled oscillator (QVCO) 16, a filter 15, and a charge pump (CP) 14.

The buffer 11 performs equalization processing on the input data $D_i$.

The comparison circuit 12 compares data signal output from the buffer 11, and a threshold value corresponding to a center value of the amplitude level of the data signal at sampling timing of the clock reproduced by the phase frequency control unit 13, and outputs the comparison result thereof as determination data DO.

For example, the comparison circuit 12 outputs the determination data DO that becomes "1" if the data signal is higher than the threshold value corresponding to a center value of the amplitude level of the data signal, and outputs the determination data DO that becomes "0" if the data signal is lower than the threshold value.

The phase frequency control unit 13 detects the phase difference and the frequency difference between the data signals output from the clock and the buffer 11, respectively using a four-phase clock output from the QVCO 16. Further, the phase frequency control unit 13 outputs phase information $PH_{UD}$ for controlling the phase of the clock, and frequency information $FR_{UD}$ for controlling the frequency of the clock to the CP 14.

The CP 14 adjusts a current value in accordance with the input phase information $PH_{UD}$, and frequency information $FR_{UD}$. Further, the filter 15 converts the current value adjusted by the CP 14 into a voltage value to output a control voltage Vctrl.

The QVCO 16 outputs the four-phase clock having an oscillation frequency changed in accordance with the voltage value of the control voltage Vctrl.

Operation Example of Comparative Example

In the following, a description will be given of an operation example of the reception circuit 10.

Figure 8:
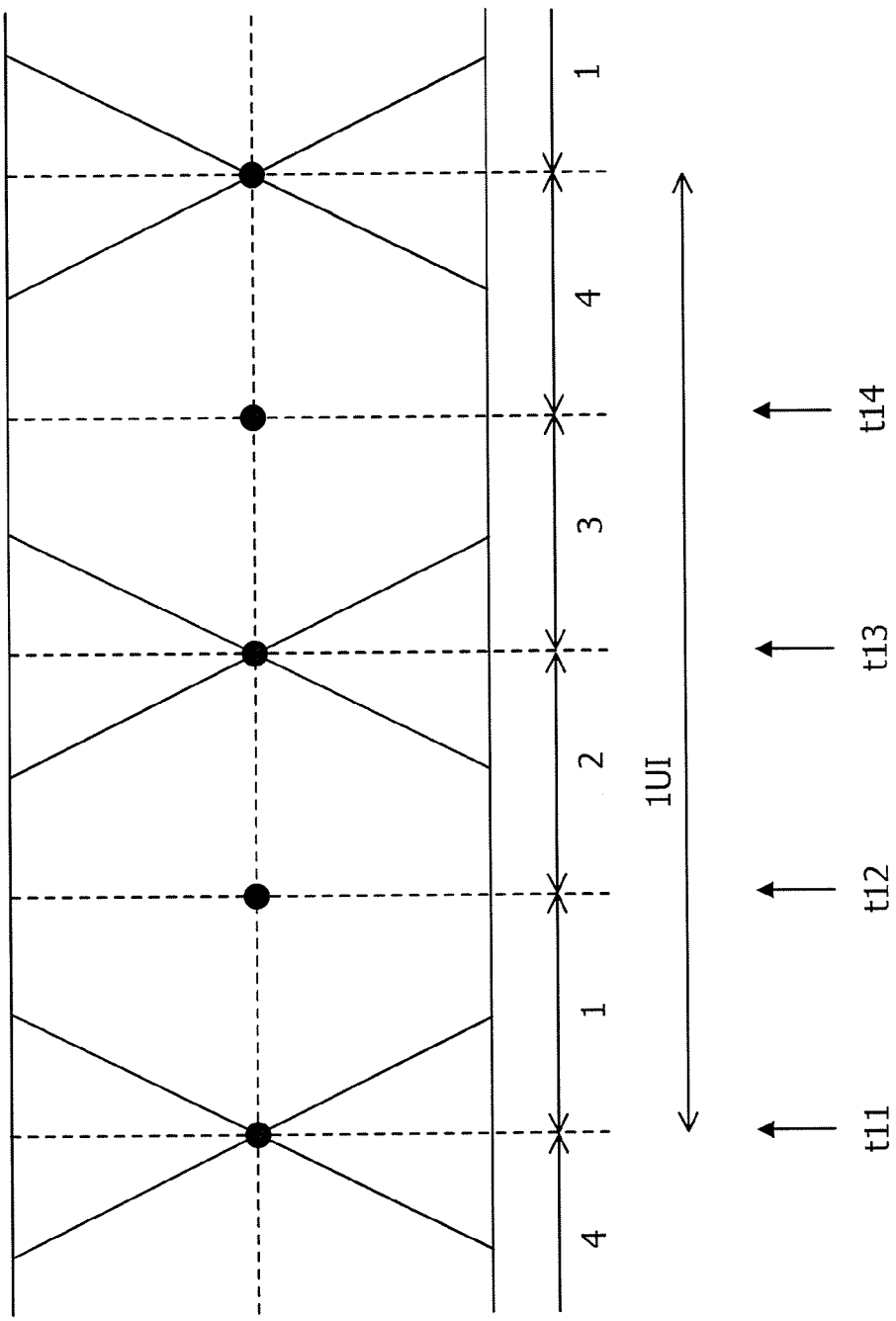
FIG. 8 is a diagram illustrating an example of a relationship between input data and sampling timing.
Figure 9:
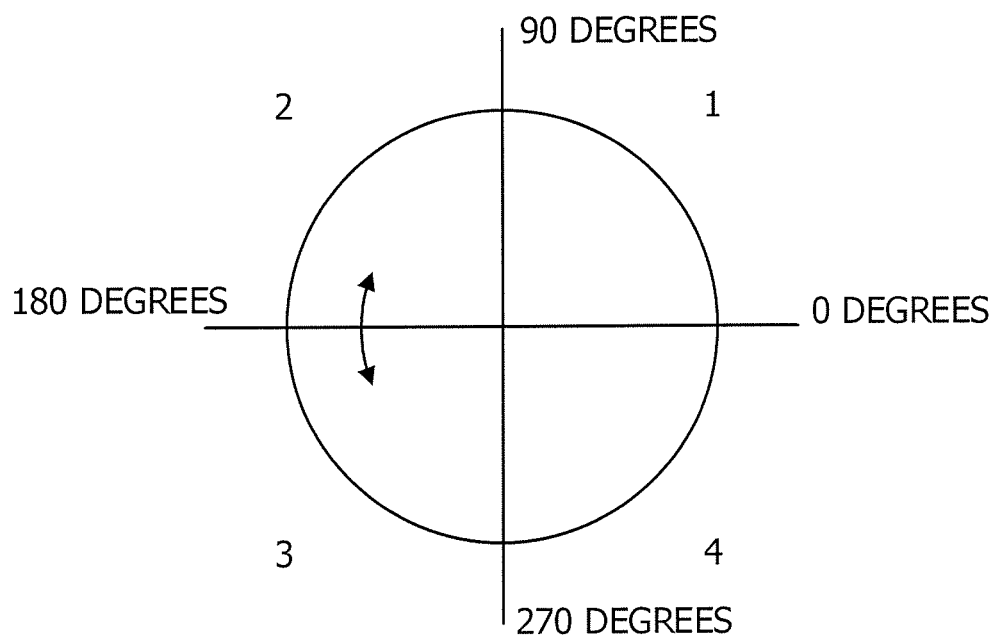
FIG. 9 is a diagram illustrating an example of phase rotation.

FIG. 8 is a diagram illustrating an example of a relationship between input data and sampling timing. FIG. 9 is a diagram illustrating an example of phase rotation. In this regard, in FIG. 8 and FIG. 9, it is assumed that the first quadrant is a range from 0 degrees to 90 degrees, the second quadrant is a range from 90 degrees to 180 degrees, the third quadrant is a range from 180 degrees to 270 degrees, and the fourth quadrant is a range from 270 degrees to 360 degrees.

In FIG. 8, sampling timing t11, t12, t13, and t14, at which the phase frequency control unit 13 performs sampling in order to detect the frequency difference between the data signal, and the clock, is illustrated.

In such a reception circuit 10, in order to determine in which of the first to the fourth quadrants an edge of the data signal is positioned, sampling is performed four times in one UI to detect the frequency difference between the data signal and the clock.

For example, it is assumed that the edge of the data signal is detected being in the second quadrant, and after that, the edge of the data signal is detected being in the third quadrant. The rotation direction of the phase of the clock at this time is a direction from the second quadrant to the third quadrant as illustrated in FIG. 9. This is a state in which a phase of the clock is being delayed with respect to the data signal with time, and the cycle of the clock is longer than one UI, that is to say, a state in which the frequency of the clock is lower with respect to that of the data signal. Accordingly, the frequency information $FR_{UD}$ that becomes "+1" is output in order to increase the frequency of the clock.

On the other hand, for example, it is assumed that the edge of the data signal is detected being in the third quadrant, and after that, the edge of the data signal is detected being in the second quadrant. The rotation direction of the phase of the clock at this time is a direction from the third quadrant to the second quadrant as illustrated in FIG. 9. This is a state in which a phase of the clock is being advanced with respect to the data signal with time, and the cycle of the clock is shorter than one UI, that is to say, a state in which the frequency of the clock is higher with respect to that of the data signal. Accordingly, the frequency information $FR_{UD}$ that becomes "−1" is output in order to decrease the frequency of the clock.

In this manner, in the reception circuit 10, the rotation direction of the phase of the clock is detected by the sampling of four times using the four-phase clock, and the frequency difference of the clock with respect to the data signal is detected. Accordingly, the circuit area is increased because of a decision circuit performing the sampling of four times, a circuit block for generating the four-phase clock, and the like.

In contrast, it is possible for the frequency detection circuit 1 according to the present embodiment to determine whether the frequency of the clocks CLK0 and CLK180 is higher or lower with respect to the input data $D_i$ by the sampling of two times using the two-phase clocks CLK0 and CLK180, and the comparison determination of three times. Accordingly, it is possible to reduce the number of times of sampling, and to reduce the number of circuits, and the like that are increased with an increase in the number of clocks, and thus to suppress an increase in the circuit area. Also, the reduction of the circuits makes it possible to reduce the power consumption.

Second Embodiment

In the following, a description will be given of an example of a reception circuit to which the frequency detection circuit 1 as described above is applied as a second embodiment.

Figure 10:
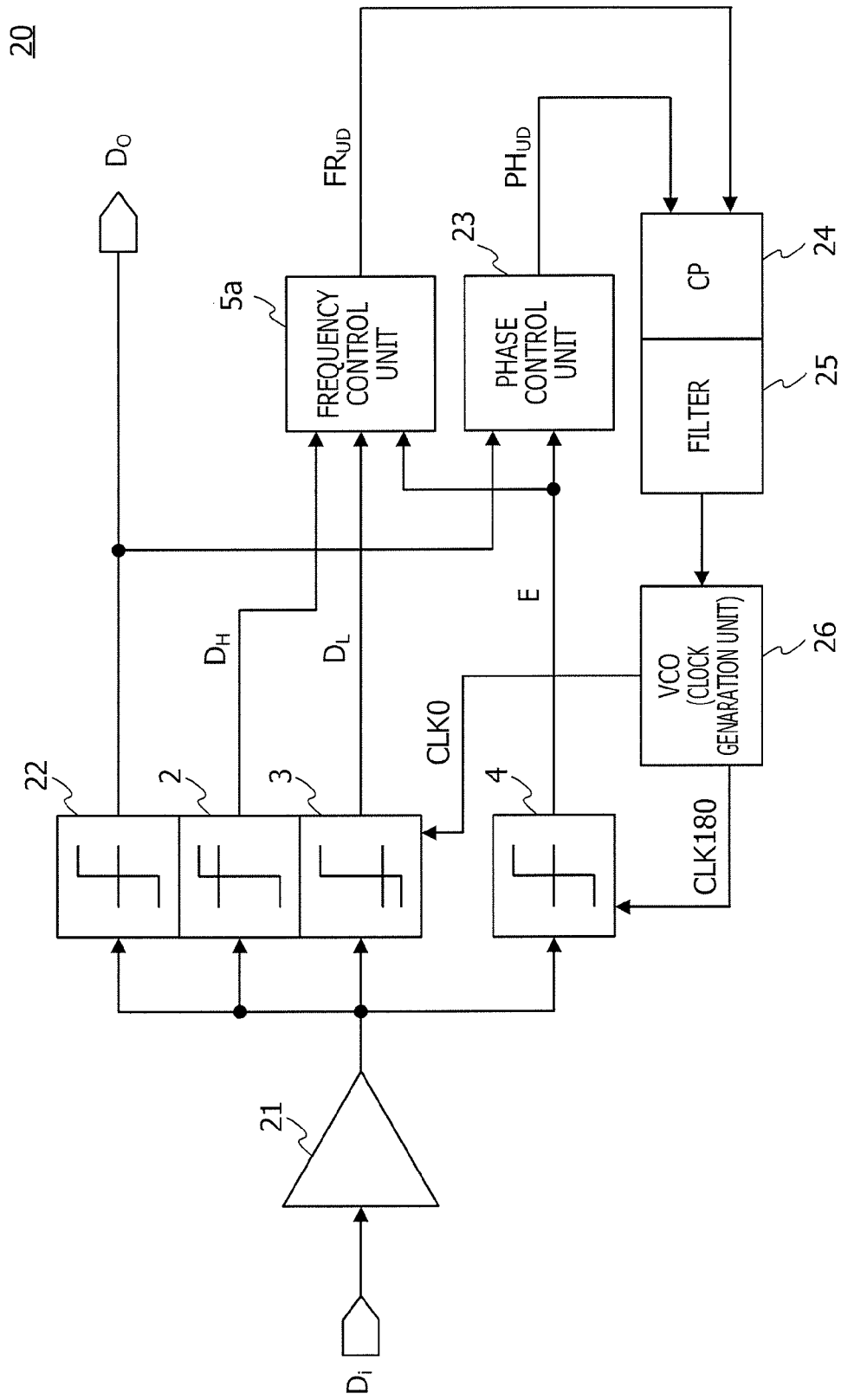
FIG. 10 is a diagram illustrating an example of the reception circuit.

FIG. 10 is a diagram illustrating an example of the reception circuit.

A same symbol is given to a same element as that of the frequency detection circuit 1 illustrated in FIG. 1, and the description thereof will be omitted. Also, in FIG. 10, control clocks that are input into a frequency control unit 5a, and the like are omitted in the illustration.

A reception circuit 20 includes a buffer 21, comparison circuits 2, 3, 4, and 22, the frequency control unit 5a, a phase control unit 23, a CP 24, a filter 25, and a VCO 26.

The buffer 21 performs equalization processing on the input data $D_i$.

The comparison circuit 22 compares the data signal output from the buffer 21, and a threshold value corresponding to a center value of the amplitude level of the data signal at timing of the clock CLK0, and outputs the comparison result thereof as determination data DO.

For example, the comparison circuit 22 outputs the determination data DO that becomes "1" if the data signal is higher than the threshold value corresponding to a center value of the amplitude level of the data signal, and outputs the determination data DO that becomes "0" if the data signal is lower than the threshold value.

The phase frequency control unit 23 detects the phase difference phase between the data signal, and the clocks CLK0 and CLK180 from the determination data DO, and the comparison result E, and outputs the phase information $PH_{UD}$ in order to control the phases of the clocks CLK0 and CLK180.

The frequency control unit 5a detects the frequency difference between the data signal and the clocks CLK0 and CLK180 from the comparison results DH, DL, and E, and outputs the frequency information $FR_{UD}$ in order to control the frequency of the clocks CLK0 and CLK180.

The CP 24 adjusts a current value in accordance with the input phase information $PH_{UD}$, and frequency information $FR_{UD}$. Further, the filter 25 converts the current value adjusted by the CP 24 into a voltage value to output a control voltage Vctrl.

The VCO 26 functions as a clock generation unit, changes the oscillation frequency in accordance with the voltage value of the control voltage Vctrl, and outputs the two-phase clocks CLK0 and CLK180.

Example of Phase Control Unit

Figure 11:
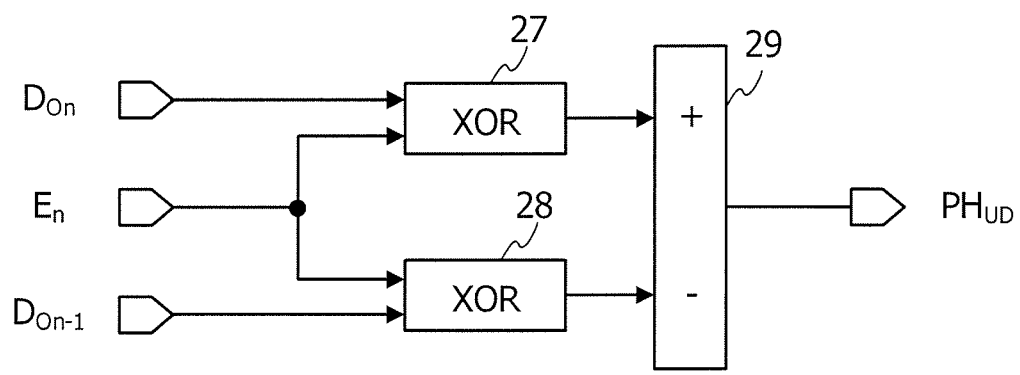
FIG. 11 is a diagram illustrating an example of a phase control unit.

FIG. 11 is a diagram illustrating an example of the phase control unit.

The phase control unit 23 includes XOR circuits 27 and 28, and an operation unit 29.

The subscripts n of a comparison result E, and determination data DO that are input into the XOR circuits 27 and 28 denote time series. For example, determination data $DO_{n-1}$ represents the determination data DO of one UI before with respect to the determination data $DO_n$.

The XOR circuit 27 performs XOR operation on the determination data $DO_n$ and the comparison result $E_n$, and outputs the operation result thereof to the operation unit 29.

The XOR circuit 28 performs XOR operation on the determination data $DO_{n-1}$ and the comparison result $E_n$, and outputs the operation result thereof to the operation unit 29.

The operation unit 29 performs operation for achieving the truth table as follows, for example, based on the operation result output from the XOR circuit 27, and the operation result output from the XOR circuit 28, and outputs phase information $PH_{UD}$.

Operation Example of Phase Control Unit

FIG. 12 is a diagram illustrating an example of a truth table achieved by the phase control unit.

The truth table illustrated in FIG. 12 indicates phase information $PH_{UD}$ that is output in accordance with four combinations of the values of the determination data $DO_{n-1}$, the comparison result $E_n$, and the determination data $DO_n$.

In the following, a description will be given of an example of a relationship between the data signal, and the clocks CLK0 and CLK180 when "+1" or "−1" is output as the phase information $PH_{UD}$.

Figure 13:
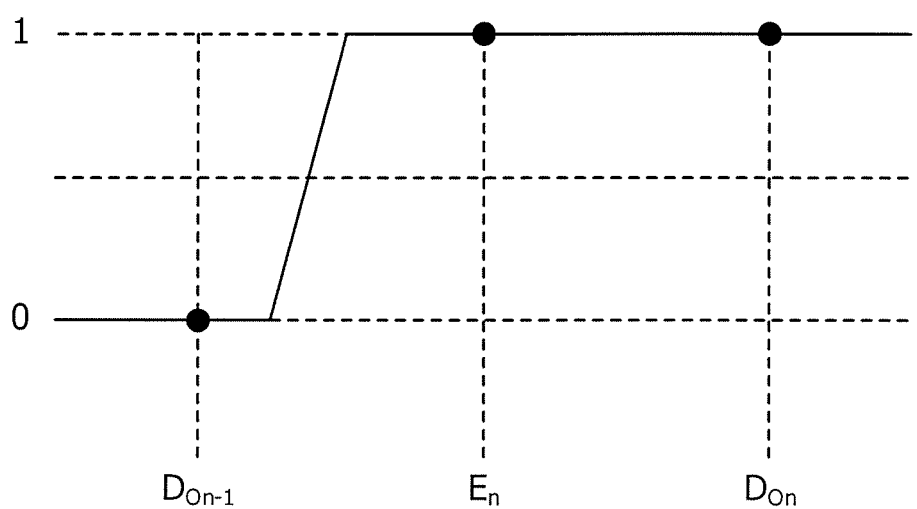
FIG. 13 is a diagram illustrating an example of a relationship among a data signal, a comparison result, and determination data when phase information $PH_{UD}$ that becomes "+1" is output.

FIG. 13 is a diagram illustrating an example of a relationship among the data signal, the comparison result, and the determination data when the phase information $PH_{UD}$ that becomes "+1" is output.

FIG. 13 illustrates a waveform of the data signal when the data signal changes from "0" to "1".

When the phase of the clocks CLK0 and CLK180 is delayed with respect to the data signal, as illustrated in FIG. 13, the determination data $DO_{n-1}$ becomes "0", and the comparison result $E_n$ and the determination data $DO_n$ become the same value "1". In this case, in order to advance the phase of the clocks CLK0 and CLK180, the phase information $PH_{UD}$ that becomes "+1" is output as the truth table illustrated in FIG. 12.

Also, when the data signal changes from "1" to "0", if the phase of the clocks CLK0 and CLK180 is delayed with respect to the data signal, the determination data $DO_{n-1}$ becomes "1", and the comparison result $E_n$ and the determination data $DO_n$ become the same value "0". In this case, as the truth table illustrated in FIG. 12, in order to advance the phase of the clocks CLK0 and CLK180, the phase information $PH_{UD}$ that becomes "+1" is output.

Figure 14:
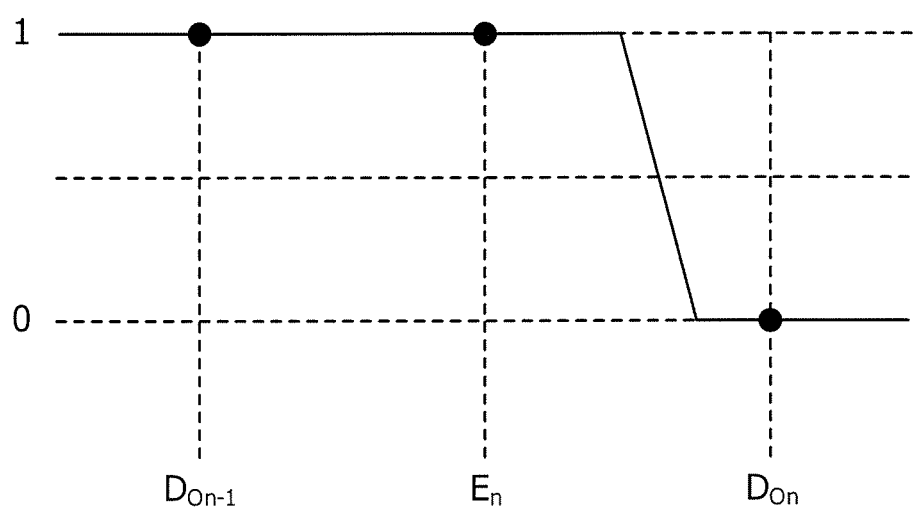
FIG. 14 is a diagram illustrating an example of a relationship among a data signal, a comparison result, and determination data when phase information $PH_{UD}$ that becomes "−1" is output.

FIG. 14 is a diagram illustrating an example of a relationship among the data signal, the comparison result, and the determination data when the phase information $PH_{UD}$ that becomes "−1" is output.

FIG. 14 illustrates a waveform of the data signal when the data signal changes from "1" to "0".

If the phase of the clocks CLK0 and CLK180 is advanced with respect to the data signal, as illustrated in FIG. 13, the determination data $DO_{n-1}$, and the comparison result $E_n$ before the change of the data signal become the same value "1", and the determination data $DO_n$ after the change of the data signal becomes "0". In this case, in order to delay the phase of the clocks CLK0 and CLK180, as the truth table illustrated in FIG. 12, the phase information $PH_{UD}$ that becomes "−1" is output.

Also, when the data signal changes from "0" to "1", if the phase of the clocks CLK0 and CLK180 is advanced with respect to the data signal, the determination data $DO_{n-1}$, and the comparison result $E_n$ become the same value "0", and the determination data $DO_n$ becomes "1". In this case, as the truth table illustrated in FIG. 12, in order to delay the phase of the clocks CLK0 and CLK180, the phase information $PH_{UD}$ that becomes "−1" is output.

Also, if the determination data $DO_{n-1}$, the comparison result $E_n$, and the determination data $DO_n$ have the values other than the combinations illustrated in FIG. 12, the phase control unit 23 sets the phase information $PH_{UD}$ to "0". In this regard, the phase control unit 23 may output "+1", "−1", and "0" of the phase information $PH_{UD}$ as a two-bit value.

Example of Frequency Control Unit

Figure 15:
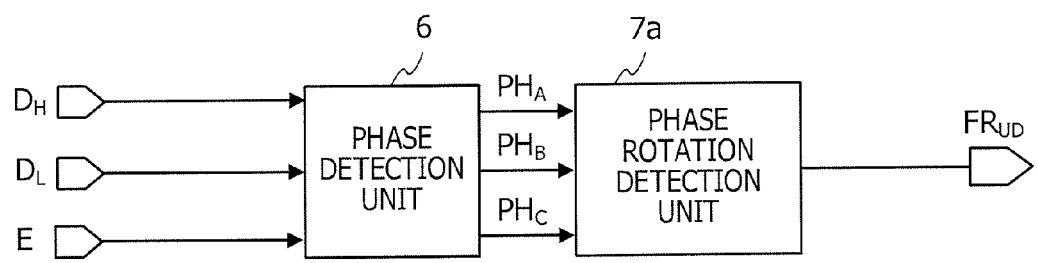
FIG. 15 is a diagram illustrating an example of a frequency control unit.

FIG. 15 is a diagram illustrating an example of the frequency control unit.

A same symbol is given to a same element as that of the frequency control unit 5 illustrated in FIG. 1, and the description thereof will be omitted.

The frequency control unit 5a includes the phase detection circuit 6, and a phase rotation detection circuit 7a.

The phase rotation detection circuit 7a detects the rotation direction of the phase of the clocks CLK0 and CLK180 based on a change in the signals $PH_A$ to $PH_C$. For example, the phase rotation detection circuit 7a performs operation for achieving the table as illustrated below to detect the rotation direction of the phase of the clocks CLK0 and CLK180, and outputs the frequency information $FR_{UD}$ for controlling the frequency of the clocks CLK0 and CLK180.

Operation Example of Frequency Control Unit

FIG. 16 is a diagram illustrating an example of frequency control by the phase rotation detection unit.

The table illustrated in FIG. 16 indicates the state before the first change (hereinafter expressed as the second state before) of the signals $PH_A$ to $PH_C$, the state after the first change and before the second change (hereinafter expressed as the first state before), and the state after the second change (hereinafter expressed as the current state). Further, the frequency information $FR_{UD}$ that is output correspondingly to these states is indicated. In this regard, "the second state before" and "the first state before" of the signals $PH_A$ to $PH_C$ may be states of the signals $PH_A$ to $PH_C$ of the states before one UI or more than "the first state before" and "the current state", respectively. For example, if "the second state before" is "$PH_B=1$", and "the first state before" is "$PH_C=1$", before "the first state before" of "$PH_C=1$", the signal $PH_B$ ($PH_B=1$) that becomes "1" for a plurality of times may be input. For example, if "the first state before" is "$PH_C=1$", and "the current state" is "$PH_A=1$", before "the current state" of "$PH_A=1$", the signal $PH_C$ that becomes "1" for a plurality of times may be input.

As illustrated in the table in FIG. 16, it is assumed that "the second state before" of the signals $PH_A$ to $PH_C$ is "$PH_B=1$", "the first state before" is "$PH_C=1$", and "the current state" is "$PH_A=1$". At this time, the phase of the clocks CLK0 and CLK180 is in a state of rotating from the area B to the area A through the area C. This is a state in which the phase of the clocks CLK0 and CLK180 with respect to the input data $D_i$ is being delayed with time, and the cycle of the clocks CLK0 and CLK180 is longer than one UI. That is to say, the state in which the frequency of the clocks CLK0 and CLK180 becomes lower with respect to the input data $D_i$. Accordingly, the phase rotation detection circuit 7a outputs the frequency information $FR_{UD}$ that becomes "+1" in order to increase the frequency of the clocks CLK0 and CLK180.

As illustrated in the table in FIG. 16, it is assumed that "the second state before" of the signals $PH_A$ to $PH_C$ is "$PH_A=1$", "the first state before" is "$PH_C=1$, and "the current state" is "$PH_B=1$". At this time, the phase of the clocks CLK0 and CLK180 is in a state of rotating from the area A to the area B through the area C. This is a state in which the phase of the clocks CLK0 and CLK180 with respect to the input data $D_i$ is being advanced with time, and the cycle of the clocks CLK0 and CLK180 is shorter than one UI. That is to say, the state in which the frequency of the clocks CLK0 and CLK180 becomes higher with respect to the input data $D_i$. Accordingly, the phase rotation detection circuit 7a outputs the frequency information $FR_{UD}$ that becomes "−1" in order to decrease the frequency of the clocks CLK0 and CLK180.

Also, if the input signals $PH_A$ to $PH_C$ have the values other than the above-described combinations, the phase rotation detection circuit 7a sets the frequency information $FR_{UD}$ to "0". In this regard, the phase rotation detection circuit 7a may output "+1", "−1", and "0" of the frequency information $FR_{UD}$ as a two-bit value.

In this manner, when the phase rotation detection circuit 7a detects the rotation direction of the phase of the clocks CLK0 and CLK180 from the area B to the area A (or from the area A to the area B) through the area C, the phase rotation detection circuit 7a sets the frequency information $FR_{UD}$ to +1 (or −1).

For example, when the frequency difference between the clocks CLK0 and CLK180 and the data signal is small, an edge of the data signal sometimes oscillates between the area B and the area C, and there is a possibility that the signals $PH_B$ and $PH_C$ repeatedly become "1". In such a case, if the frequency information $FR_{UD}$ of "+1", which is output when a phase rotation from the area B to the area C is detected, and frequency information $FR_{UD}$ of "−1", which is output when a phase rotation from the area C to the area B is detected, are output about the same number of times, the frequency difference is maintained. However, if either "+1" or "−1" of the frequency information $FR_{UD}$ is output because of the data pattern of the data signal, and the like, the frequency difference between the clocks CLK0 and CLK180, and the data signal is widened. As described above, in the phase rotation detection circuit 7a, when a phase change spreading over the three areas A to C in the same rotation direction is detected, the frequency information $FR_{UD}$ of +1 or −1 for controlling the frequency is output so that it is possible to avoid performing erroneous frequency control as described above.

Also, it is possible for the phase rotation detection circuit 7a to hold the states of the signals $PH_A$ to $PH_C$ in a storage unit not illustrated, and to use the states as "the second state before" and "the first state before" illustrated in FIG. 16. In such a case, when the states of the signals $PH_A$ to $PH_C$ are changed, it is possible to update "the current state" after a change in the states of the signals $PH_A$ to $PH_C$ to "the first state before" of the storage unit, to update "the first state before" to "the second state before" of the storage unit, and then to use the states.

Incidentally, each time the phase detection circuit 6 receives a detection result, the phase rotation detection circuit 7a ought to detect the rotation direction of the phase, and continue to output the frequency information $FR_{UD}$ of "+1" or "−1" based on the rotation direction even if the detection result is not changed until the rotation direction is changed. A description will be given of an example of the frequency control in the following.

Figure 17:
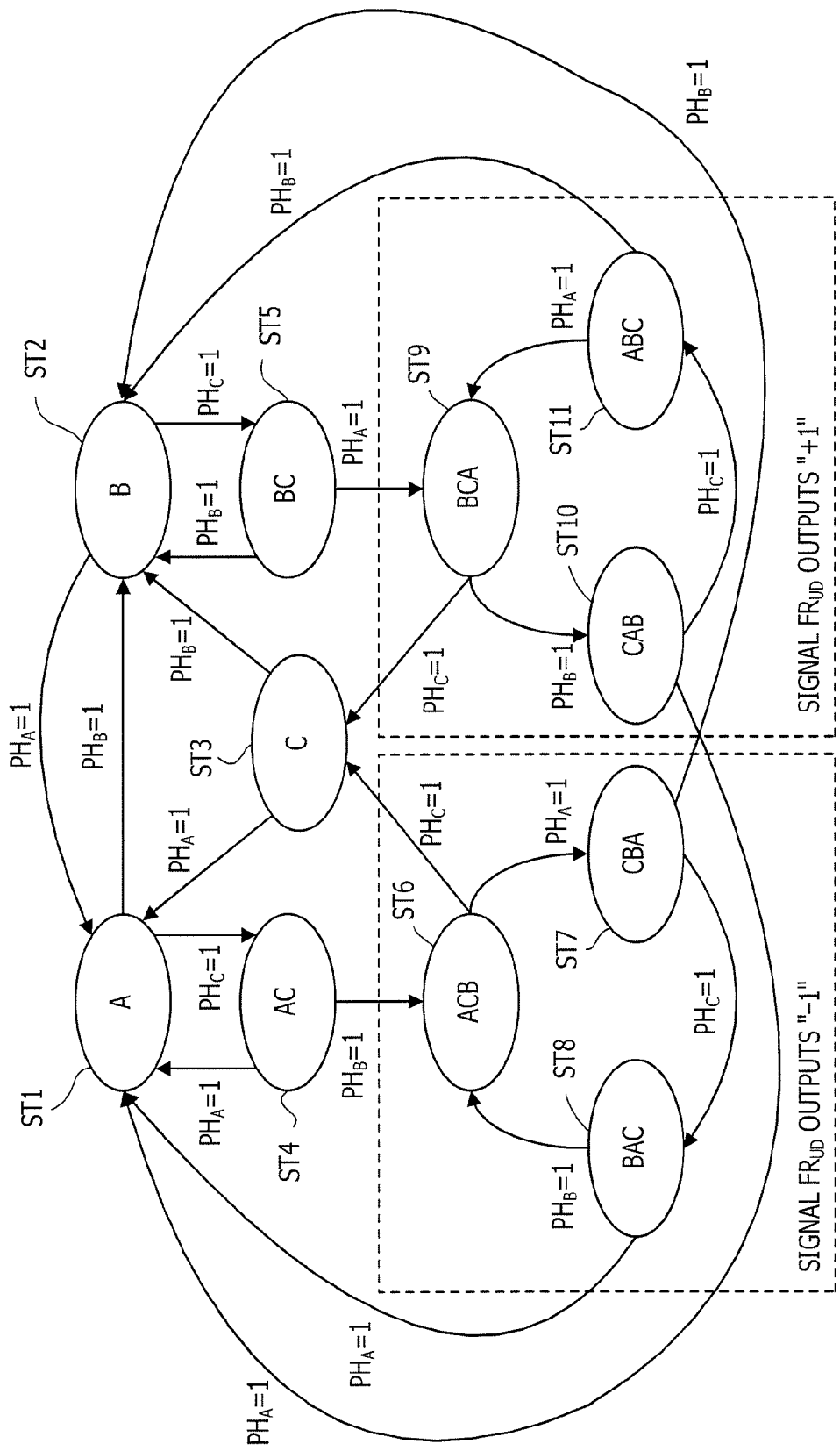
FIG. 17 is a state transition diagram illustrating an example of a frequency control method by the phase rotation detection unit.

FIG. 17 is a state transition diagram illustrating an example of a frequency control method by the phase rotation detection unit.

An example of changes in individual control states ST1 to ST11 of the phase rotation detection circuit 7a is illustrated. Symbols "A", "B", and "C" attached to the control states ST1 to ST3 in FIG. 17 denote an area (any one of the areas A to C) where an edge of the data signal is positioned in the control states ST1 to ST3. Also, symbols "AC", "ACB", and the like attached to the control states ST4 to ST11 in FIG. 17 indicate from which area an edge of the data signal has come to the current area. For example, in the case of "ACB", an edge of the data signal has come to the area B through the area A and the area C.

In the control state ST1, if the signal $PH_C$ becomes "1", the control state changes to the control state ST4. Also, in the control state ST4, if the signal $PH_A$ becomes "1", the control state returns to the control state ST1. Also, in the control state ST1, if the signal $PH_B$ becomes "1", the control state changes to the control state ST2.

In the control state ST2, if the signal $PH_C$ becomes "1", the control state changes to the control state ST5. Also, in the control state ST5, if the signal $PH_B$ becomes "1", the control state returns to the control state ST2. Also, in the control state ST2, if the signal $PH_A$ becomes "1", the control state changes to the control state ST1.

In the control state ST3, if the signal $PH_A$ becomes "1", the control state changes to the control state ST1. Also, in the control state ST3, if the signal $PH_B$ becomes "1", the control state changes to the control state ST2.

In the control states ST1 to ST5, the phase rotation detection circuit 7a sets the frequency information $FR_{UD}$ to "0", and does not change the frequency of the clocks CLK0 and CLK180.

In the control state ST4, if the signal $PH_B$ becomes "1", the control state changes to the control state ST6.

In the control state ST6, if the signal $PH_C$ becomes "1", the control state changes to the control state ST3. Also, in the control state ST6, if the signal $PH_A$ becomes "1", the control state changes to the control state ST7.

In the control state ST7, if the signal $PH_B$ becomes "1", the control state changes to the control state ST2. Also, in the control state ST7, if the signal $PH_C$ becomes "1", the control state changes to the control state ST8.

In the control state ST8, if the signal $PH_A$ becomes "1", the control state changes to the control state ST1. Also, in the control state ST8, if the signal $PH_B$ becomes "1", the control state changes to the control state ST6.

The control states ST6 to ST8 are states in which the cycle of the clocks CLK0 and CLK180 is shorter than one UI, that is to say, a state in which the frequency of the clocks CLK0 and CLK180 is higher with respect to the data signal. Accordingly, the phase rotation detection circuit 7a sets the frequency information $FR_{UD}$ to "−1" in order to decrease the frequency.

When the control state repeats the control states ST6 to ST8, that is to say, while an area in which an edge is detected continues to rotate in the same direction in the order of the area B, the area A, the area C, the area B, . . . , the phase rotation detection circuit 7a continues to output the frequency information $FR_{UD}$ that becomes "−1".

In the control states ST5, if the signal $PH_A$ becomes "1", the control state changes to the control state ST9.

In the control state ST9, if the signal $PH_C$ becomes "1", the control state changes to the control state ST3. Also, in the control state ST9, if the signal $PH_B$ becomes "1", the control state changes to the control state ST10.

In the control state ST10, if the signal $PH_A$ becomes "1", the control state changes to the control state ST1. Also, in the control state ST10, if the signal $PH_C$ becomes "1", the control state changes to the control state ST11.

In the control state ST11, if the signal $PH_B$ becomes "1", the control state changes to the control state ST2. Also, in the control state ST11, if the signal $PH_A$ becomes "1", the control state changes to the control state ST9.

The control states ST9 to ST11 are states in which the cycle of the clocks CLK0 and CLK180 is longer than one UI, that is to say, a state in which the frequency of the clocks CLK0 and CLK180 is lower with respect to the data signal. Accordingly, the phase rotation detection circuit 7a sets the frequency information $FR_{UD}$ to "+1" in order to increase the frequency.

When the control state repeats the control states ST9 to ST11, that is to say, while an area in which an edge is detected continues to rotate in the same direction in the order of the area A, the area B, the area C, the area A, . . . , the phase rotation detection circuit 7a continues to output the frequency information $FR_{UD}$ that becomes "+1".

In the control as described above, even if an area in which an edge is detected is not changed, in the control states ST6 to ST8 or the control states ST9 to ST11, each time the signals $PH_A$ to $PH_C$ are input (each time the signals are updated), the frequency information $FR_{UD}$ that becomes "−1" or "+1" is continued to be output. Thereby, the frequency of outputting the frequency information $FR_{UD}$ that becomes "−1" or "+1" is increased, and thus it is possible to increase the speed of adjusting the frequency.

Third Embodiment

In the following, a description will be given of another example of the reception circuit as a third embodiment.

Figure 18:
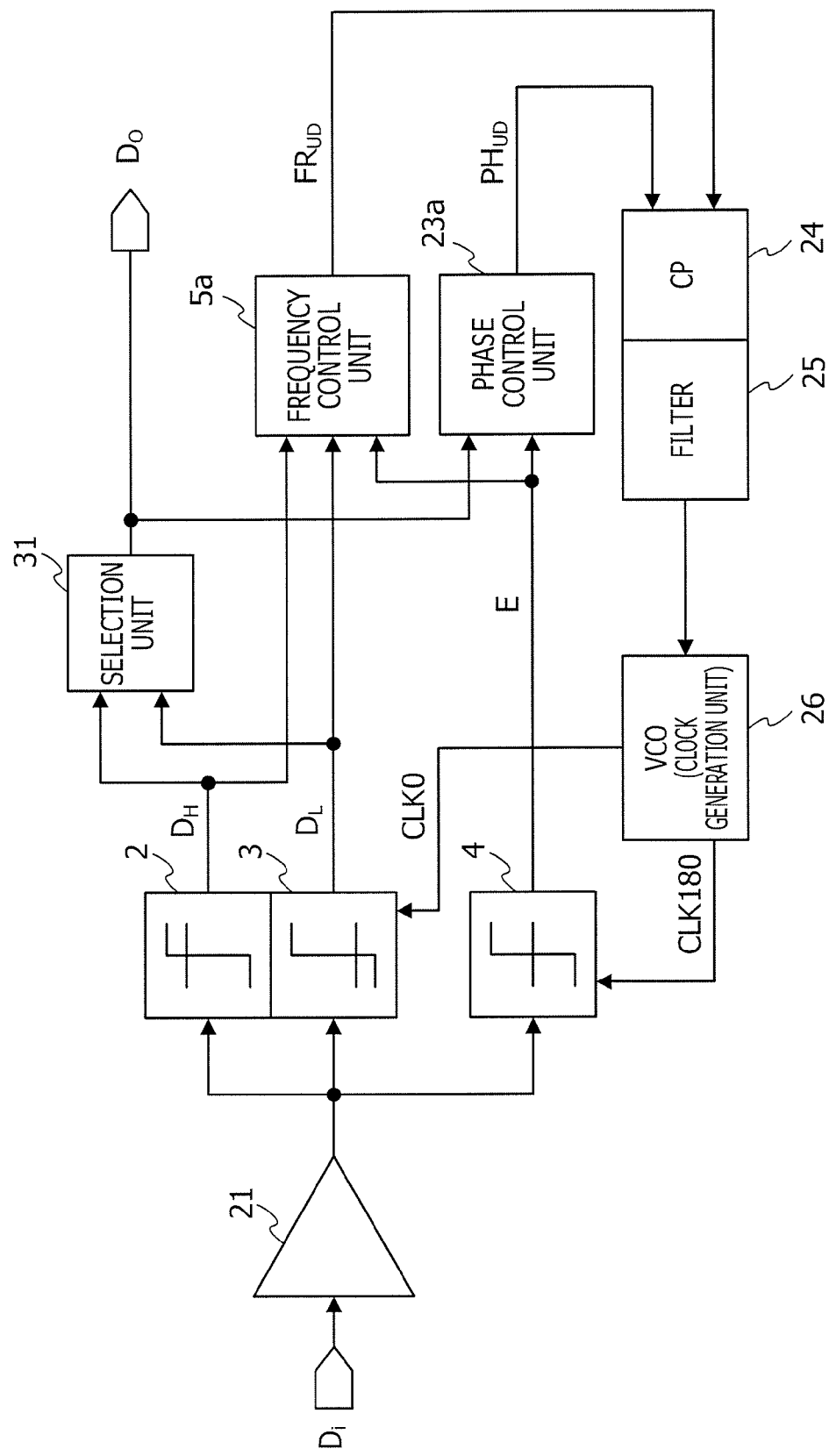
FIG. 18 is a diagram illustrating another example of the reception circuit.

FIG. 18 is a diagram illustrating another example of the reception circuit.

A same symbol is given to a same element as that of the reception circuit 20 illustrated in FIG. 10, and the description thereof will be omitted. Also, in FIG. 18, control clocks that are input into a frequency control unit 5a, and the like are omitted in the illustration.

A reception circuit 30 is a reception circuit having a function of speculative decision feedback equalizer (DFE), and includes a buffer 21, comparison circuits 2, 3, and 4, a frequency control unit 5a, a phase control unit 23a, a CP 24, a filter 25, a VCO 26, and a selection unit 31.

Figure 19:
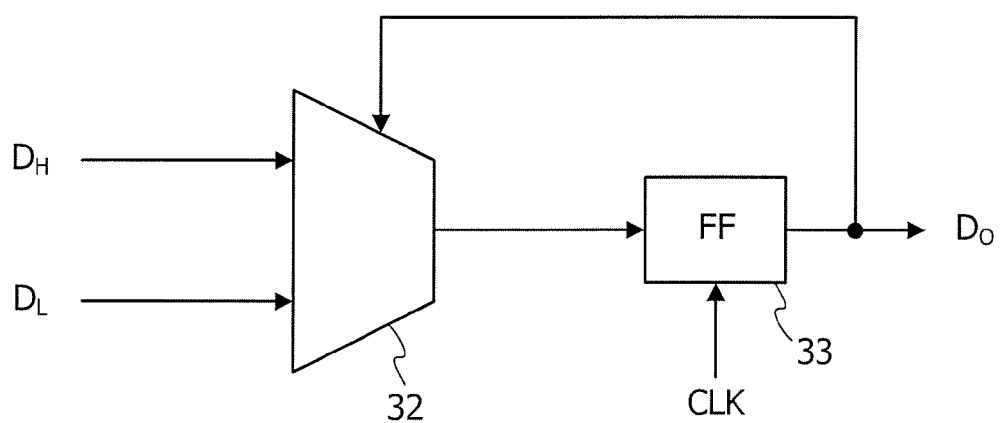
FIG. 19 is a diagram illustrating an example of a selection unit.

FIG. 19 is a diagram illustrating an example of the selection unit.

The selection unit 31 includes a selector 32, and an FF (flip-flop) 33.

The selector 32 selects one of the comparison results $D_H$ and $D_L$ that are input from the comparison circuits 2 and 3, respectively, based on the determination data DO that is input as a selection signal, and outputs the comparison result to the FF 33. For example, if the determination data DO before one UI is "1", the selector 32 outputs the comparison result $D_H$, and if the determination data DO before one UI is "0", the selector 32 outputs the comparison result $D_L$.

The FF 33 holds the value output from the selector 32 in synchronism with a clock CLK, and outputs the held value as the determination data DO. Also, it is possible to use the clock CLK0 for the clock CLK, for example.

The phase control unit 23a detects the phase difference between the data signal, and the clocks CLK0 and CLK180 from the determination data DO output from the selection unit 31, and the comparison result E described above, and outputs the phase information $PH_{U/D}$ in order to control the phases the clocks CLK0 and CLK180.

In this manner, the reception circuit 30 achieves the speculative DFE by the comparison circuits 2 and 3, and the selection unit 31. By the reception circuit 30 like this, it is possible to obtain the same advantages as those of the reception circuit 20 illustrated in FIG. 10.

Further, the reception circuit 30 achieves the function of the speculative DFE using the comparison results $D_H$ and $D_L$ of the comparison circuits 2 and 3, respectively. Accordingly, it is possible to restrain an increase in the circuit area accompanied by addition of the function of the speculative DFE.

In this regard, the frequency detection circuit, and the reception circuit are not limited to the examples described above. For example, it is also possible to use the above-described frequency detection circuit, and reception circuit at the time of interleaving operation. In the following, a variation of the frequency detection circuit 1 according to the first embodiment is illustrated in FIG. 20.

Variation

Figure 20:
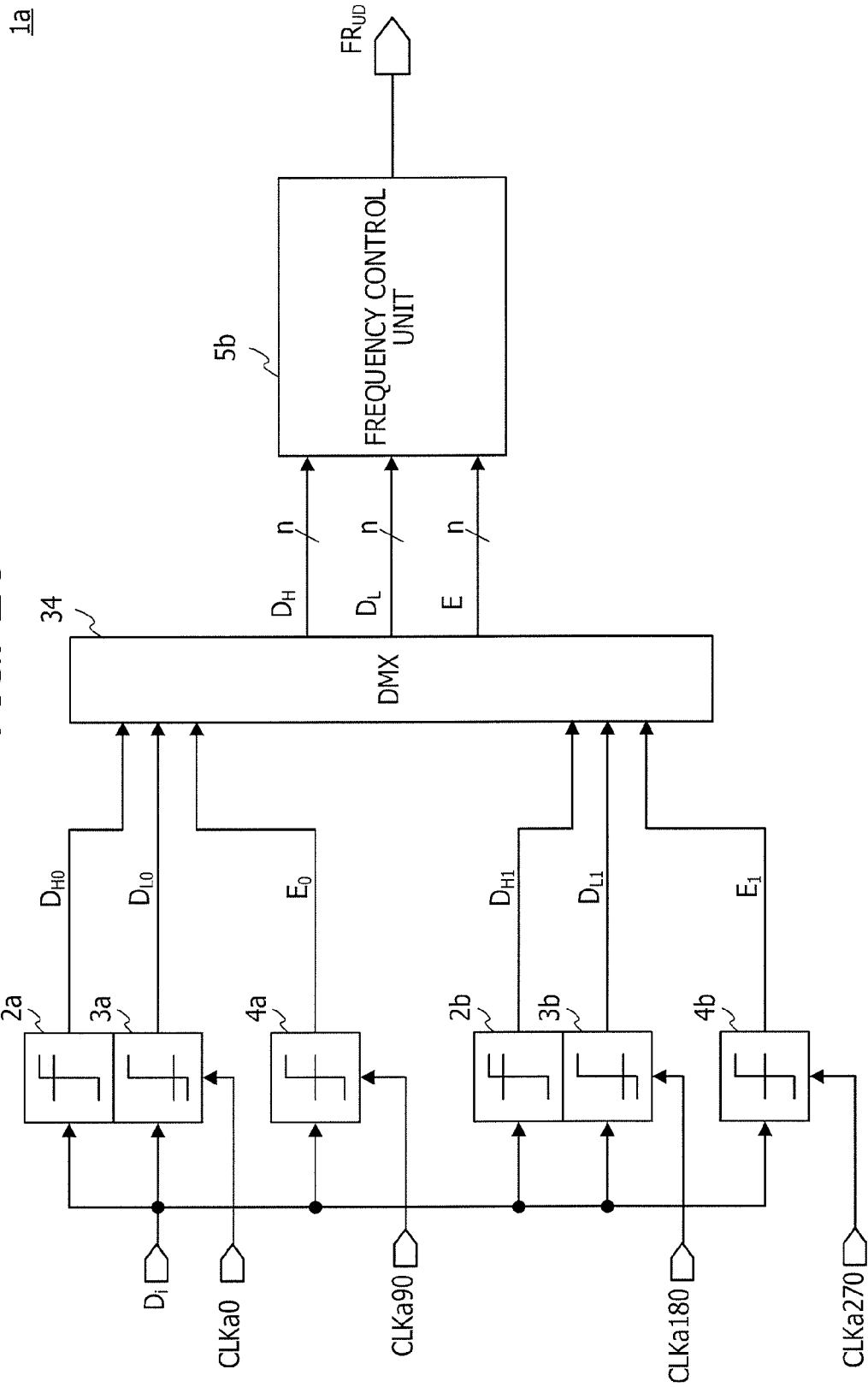
FIG. 20 is a diagram illustrating a variation of the frequency detection circuit.

FIG. 20 is a diagram illustrating a variation of the frequency detection circuit.

A same symbol is given to a same element as that of the frequency detection circuit 1 illustrated in FIG. 1, and the description thereof will be omitted.

A frequency detection circuit 1a includes comparison circuits 2a, 3a, 4a, 2b, 3b, 4b, a demultiplexer (hereinafter denoted as a DMX) 34, and a frequency control unit 5b.

In order to make it possible to perform interleaving operation, the frequency detection circuit 1a has a parallel structure of the comparison circuits 2a to 4a, and the comparison circuits 2b to 4b. Thereby, it becomes possible to perform operation by executing parallel processing when the input data $D_i$ has a high frequency.

The comparison circuits 2a and 2b compare the input data $D_i$ with the threshold value $V_H$ at timing of the clocks CLKa0 and CLKa180, respectively, and output the comparison results $D_{H0}$ and $D_{H1}$, respectively.

The comparison circuits 3a and 3b compares the input data $D_i$ with the threshold value $V_L$ at timing of the clocks CLKa0 and CLKa180, respectively, and outputs the comparison results $D_{L0}$ and $D_{L1}$, respectively.

The comparison circuits 4a and 4b compare the input data $D_i$ and the threshold value $V_0$ at timing of the clocks CLKa90 and CLKa270, respectively, and output the comparison results $E_0$ and $E_1$, respectively.

Also, the frequency of the clocks CLKa0 to CLKa270 is half the frequency of the clocks CLK0 and CLK180 according to the first embodiment. Also, the phase relationship among the clocks CLKa0 to CLKa270 is as follows. For example, assuming that the phase of the clock CLKa0 is a basis (0 degrees), the clock CLKa90 has a phase difference of 90 degrees with respect to the clock CLKa0. Also, the clock CLKa180 has a phase difference of 180 degrees with respect to the clock CLKa0. Also, the clock CLKa270 has a phase difference of 270 degrees with respect to the clock CLKa0.

The DMX 34 performs demultiplexing on two bits into n bits, and outputs the data. The DMX 34 performs demultiplexing on the two bits including one-bit comparison results $D_{H0}$ and $D_{H1}$, respectively, to output as an n-bit comparison result $D_H$, and performs demultiplexing on the two bits including one-bit comparison results $D_{L0}$ and $D_{L1}$, respectively, to output as an n-bit comparison result $D_L$. Further, the DMX 34 performs demultiplexing on the two bits including one-bit comparison results $E_0$ and $E_1$, respectively, to output as an n-bit comparison result E.

In this manner, it becomes possible for the frequency detection circuit 1a to operate by performing parallel processing even if the frequency of the input data $D_i$ is high.

The other operation is performed in the same manner as the frequency detection circuit 1 according to the first embodiment, and thus the same advantages as those of the frequency detection circuit according to the first embodiment is obtained.

In this regard, the frequency detection circuit 1a is a circuit performing interleaving operation by two elements in parallel. However, the number of elements in parallel is not limited, and three elements or more may be configured in parallel. The frequency of the clock signal is decreased in accordance with the number of elements in parallel, and the number of clock signals having a different phase relationship is increased so that it becomes possible to achieve frequency detection processing by a lower-speed circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A frequency detection circuit comprising:
a first comparison circuit configured to output a first comparison result produced by comparison between a second threshold value higher than a first threshold value corresponding to a center value of an amplitude level of input data, and the input data at first timing of a first clock;
a second comparison circuit configured to output a second comparison result produced by comparison between a third threshold value lower than the first threshold value, and the input data at the first timing;
a third comparison circuit configured to output a third comparison result produced by comparison between the input data, and the first threshold value at second timing of a second clock having a phase shifted from that of the first clock;

a phase detector configured to determine in which one of the areas an edge of the input data is positioned among the three areas produced by dividing a phase in a one-bit width time into three areas based on the first comparison result, the second comparison result, and the third comparison result; and a phase rotation detector configured to detect a rotation direction of the phase based on a change of a detection result in the phase detector so as to determine whether a second frequency of the first clock or the second clock is higher or lower with respect to a first frequency of the input data.

2. The frequency detection circuit according to claim 1, wherein among the three areas, a first area is set to have a width based on a slew rate of the input data, the second threshold value, and the third threshold value between a second area and a third area.

3. The frequency detection circuit according to claim 1, wherein the phase rotation detector is configured to output a signal for changing the second frequency based on the rotation direction when a change of the edge spreading over the three areas in the same rotation direction is detected from the detection result by the phase detector.

4. The frequency detection circuit according to claim 1, wherein the phase rotation detector is configured to detect the rotation direction each time the phase detector receives the detection result, and continue to output a signal for changing the second frequency based on the rotation direction until the rotation direction is changed even if the detection result is not changed.

5. A reception circuit comprising:

a first comparison circuit configured to output a first comparison result produced by comparison between a second threshold value higher than a first threshold value corresponding to a center value of an amplitude level of input data, and the input data at first timing of a first clock;

a second comparison circuit configured to output a second comparison result produced by comparison between a third threshold value lower than the first threshold value, and the input data at the first timing;

a third comparison circuit configured to output a third comparison result produced by comparison between the input data, and the first threshold value at second timing of a second clock having a phase shifted from that of the first clock;

a phase detector configured to determine in which one of the areas an edge of the input data is positioned among the three areas produced by dividing a phase in a one-bit width time into three areas based on the first comparison result, the second comparison result, and the third comparison result;

a phase rotation detector configured to detect a rotation direction of the phase based on a change of a detection result in the phase detector so as to determine whether a second frequency of the first clock or the second clock is higher or lower with respect to a first frequency of the input data;

a fourth comparison circuit configured to output a fourth comparison result produced by comparison between the input data and the first threshold value at the first timing;

a phase control unit configured to detect a phase difference between the input data, and the first clock or the second clock based on the third comparison result and the fourth comparison result; and a clock generation unit configured to generate the first clock and the second clock based on the phase difference and the rotation direction.

6. A reception circuit comprising:

a first comparison circuit configured to output a first comparison result produced by comparison between a second threshold value higher than a first threshold value corresponding to a center value of an amplitude level of input data, and the input data at first timing of a first clock;

a second comparison circuit configured to output a second comparison result produced by comparison between a third threshold value lower than the first threshold value, and the input data at the first timing;

a third comparison circuit configured to output a third comparison result produced by comparison between the input data, and the first threshold value at second timing of a second clock having a phase shifted from that of the first clock;

a phase detector configured to determine in which one of the areas an edge of the input data is positioned among the three areas produced by dividing a phase in a one-bit width time into three areas based on the first comparison result, the second comparison result, and the third comparison result;

a phase rotation detector configured to detect a rotation direction of the phase based on a change of a detection result in the phase detector so as to determine whether a second frequency of the first clock or the second clock is higher or lower with respect to a first frequency of the input data;

a selection unit configured to select either the first comparison result or the second comparison result as a first data determination result based on a second data determination result before the one-bit width time;

a phase control unit configured to detect a phase difference between the input data, and the first clock or the second clock based on the third comparison result and the first data determination result; and a clock generation unit configured to generate the first clock and the second clock based on the phase difference and the rotation direction.

* * * * *